United States Patent [19]

Marengo

[11] Patent Number: 4,897,326

[45] Date of Patent: Jan. 30, 1990

[54] PROCESS TO MANUFACTURE PRINTED CIRCUIT BOARDS

[75] Inventor: Giuseppe Marengo, Milan, Italy

[73] Assignee: Telettra-Telefonia Electronica e Radio, S.p.A., Italy

[21] Appl. No.: 835,479

[22] Filed: Mar. 3, 1986

[30] Foreign Application Priority Data

Apr. 9, 1985 [IT] Italy ................................ 20284 A/85

[51] Int. Cl.$^4$ ............................................. G03G 13/22
[52] U.S. Cl. .......................................... 430/31; 430/49
[58] Field of Search ...................... 430/31, 128, 49, 66, 430/67, 126, 306, 313, 319

[56] References Cited

U.S. PATENT DOCUMENTS

| | | | |
|---|---|---|---|
| 3,862,352 | 1/1975 | Berman | 430/11 |
| 4,327,167 | 4/1982 | Tanabe | 430/31 |
| 4,350,748 | 9/1982 | Lind | 430/49 |
| 4,371,599 | 2/1983 | Lind et al. | 430/306 |
| 4,504,529 | 3/1985 | Sorensen et al. | 430/16 |
| 4,548,885 | 10/1985 | Brechlin | 430/50 |
| 4,661,431 | 4/1987 | Bujese et al. | 430/126 |

*Primary Examiner*—John L. Goodrow
*Attorney, Agent, or Firm*—Ostrolenk, Faber, Gerb & Soffen

[57] ABSTRACT

Printed circuit boards (PCBs) are disclosed comprising a support which on a major side carries circuit components in a desired design and on a second major side carries the soldered wires corresponding to said circuit components. Manufacturing of the PCBs is carried out by producing respective designs of the component and soldering sides as labile electrostatic images on which conductive metallic powder (toner) is applied. The so obtained images are printed on respective insulating sheets, one with the component side design, and another with the solder side design. The thus printed sheets are fixed on the PCB support, and the conductive designs are treated to increase the thickness of the design.

12 Claims, 6 Drawing Sheets

PROCESS TO MANUFACTURE PRINTED CIRCUIT BOARDS

BACKGROUND OF THE INVENTION

The present invention relates to a method of making printed circuit boards (PCBs), and particularly to a method of easily forming the printed circuit patterns on either side of the PCBs, and also relates to the PCBs thereby made.

It is generally known that the PCBs are not only used in electronics, but also in circuits for much other electrical equipment. The development of such electrical equipment is fast and obstacles are found only in the manufacturing process of the PCBs. In fact, the widespread conventional process is long and expensive. It involves a great deal of wasted material, some of which is precious. Additionally, it leads to considerable ecological problems to eliminate the wasted material.

The conventional manufacturing process adopted by almost all PCB manufacturers involves, in its initial portion, at least the following steps:

1. application of a CAD processor output to a photographic plotter, which has the disadvantage of having to operate in a dark room;
2. preparation of a set of films (at least three films, i.e., two for the two faces and one for the solder resist); if six layers are required, six films are necessary plus the solder resist film mask, such films corresponding to the photographic negatives.
3. use of silk screen racks;
4. coating of the photographic emulsion;
5. contact printing in which the films produced in step 2 are positioned one at a time and illuminated to obtain a positive;
6. development;
7. completion of the silk screen (i.e., the circuit layout);
7'. obtaining the finished silk screen with solder resist;
8. operations such as finishing, drilling and blocking-out.

FIG. 1 illustrates a simplified example of a conventional process by showing the shapes that the PCB assumes during preparation; FIG. 1A shows how a layer of copper Cu is applied to each major face I and II of a thick and rigid dielectric support S; FIG. 1B illustrates a layer of plating resist R applied to uncovered sections I and II, whereas area III is not covered by the resist R. In FIG. 1C, a layer of tin-lead (Sn-Pb) is applied to III. In FIG. 1D, all of the masking plating-resist R is taken away whereby the Cu layer covered by Sn-Pb is uncovered only in zone III; and in FIG. 1E chemical etching is carried out which removes the whole initial layer of copper as well as the one in zone III protected by the Sn-Pb layer that does not resist the chemical attack.

Moreover, to produce drilled boards, drilling must be done immediately after the operation of FIG. 1A. However, to internally metallize the holes, layers of chemical copper are first applied and are followed by layers of galvanic copper on both faces I and II. Afterwards, the procedure shown in FIG. 1B is followed, i.e., covering, application of Sn-Pb, removal of the plating resist and chemical etching. As already pointed out, the conventional processes are not only time consuming but are also expensive as regards waste material. This gives rise to pollution when eliminating the waste material.

In particular, the conventional process does not only involve many operations like the above-mentioned preparation of negative (2), silk screen racks (3), layout of photographic emulsion (4), printing (5) and development (6), but is also redundant in that these operations are repeated at least as many times as there are different layers, in addition to preparing the solder resist. From FIGS. 1A and 1B it can be seen that in order to cover only section III it is necessary to cover in the initial phase all major faces of rigid support S first with copper and then with plating resist R. Almost 90 percent of the copper and resist R is removed and essentially wasted, thus giving rise to the ecological waste disposal.

SUMMARY OF THE INVENTION

A main object of the invention is to provide a process which does not have the disadvantage of the above-described conventional procedures, involves fewer and simpler operations, and also avoids the waste of precious material.

Another object is to provide printed circuit boards with a simpler and more economical structure than conventional ones.

The foregoing objects are attained with the process of the invention, which, in a preferred form, comprises:
(A) transforming the designs of the component side and of the solder side of a PCB into labile electrostatic images on a drum, on which images of conductive material (e.g., toner) is deposited and fixed;
(B) printing the tracks of said conductive material on flexible insulating sheets;
(C) firmly applying the so printed sheets on two major faces of a thick and rigid PCB support;
(D) treating said rigid support carrying the insulating sheets on its two major faces, to thicken the section of the designs printed on the sheets; and
(E) performing conventional or other mechanical workings on the thus-formed PCB to give the PCB its final shape and to make electrical interconnections between sides of the board.

The invention also comprises printed circuit boards comprising a thick and rigid support which carries on its major faces, insulating sheets printed with conductive patterns. The patterns are thickened according to the component side pattern and the soldering side pattern.

BRIEF DESCRIPTION OFF THE DRAWINGS

Various other aspects and advantages of the invention will become clear from the following description of the the preferred embodiments, represented in the attached drawings in which.

DETAILED DESCRIPTION OF THE PREFERRED EMBODIMENT

Figure 1A:
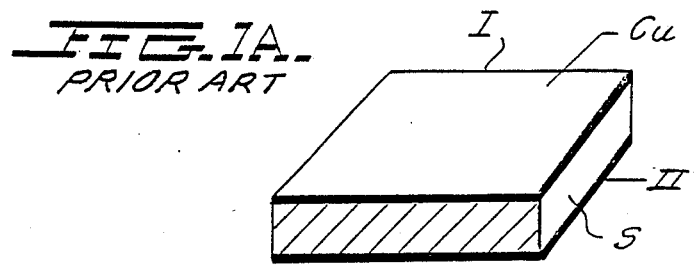
FIGS. 1A–1E show a PCB at various stages of manufacture according to the prior art.
Figure 1B:
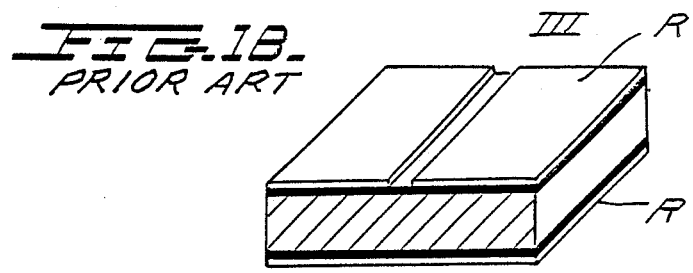
Figure 1C:
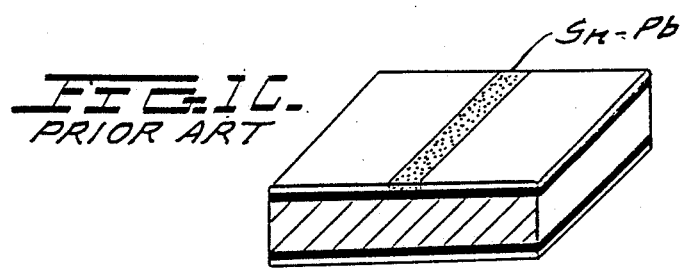
Figure 1D:
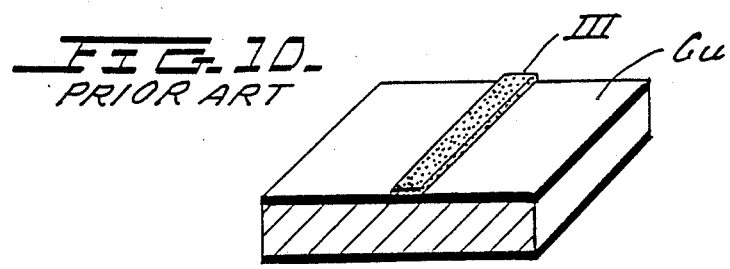
Figure 1E:
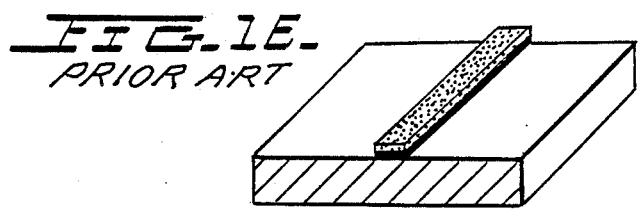
Figure 2:
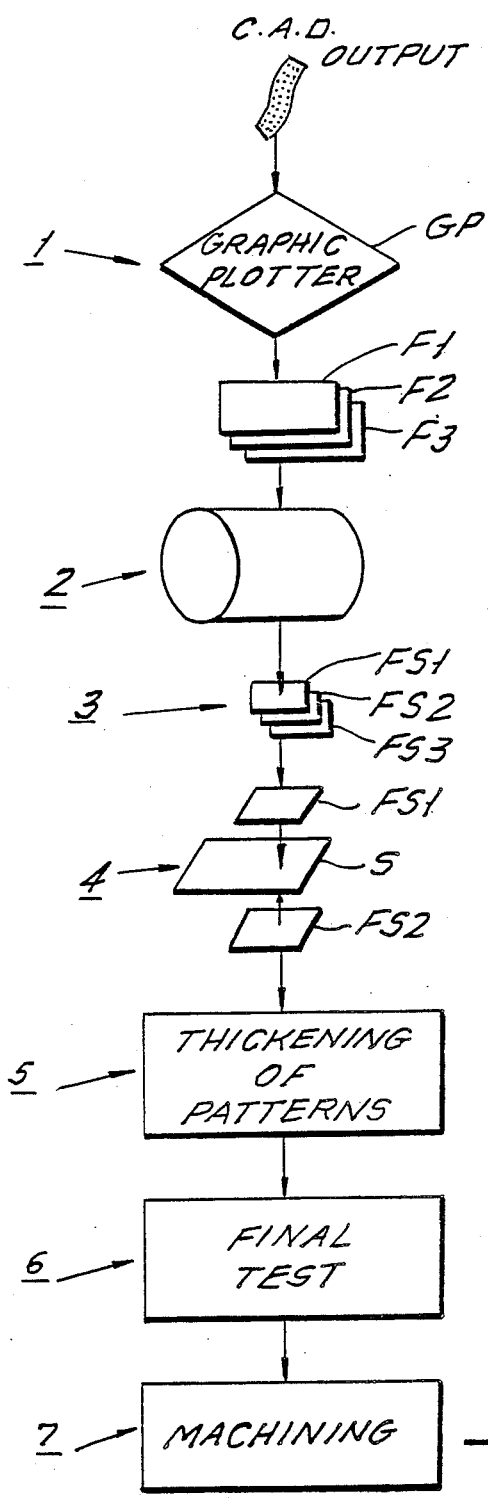
FIG. 2 shows a process scheme of the invention.

The embodiment of FIG. 2, even if complex, is given to show the process in its most general form and thus to make it easy to understand.

In step 1, a CAD output is applied to a non-photographic plotter, such as a graphical plotter GP. With this plotter it is possible to reproduce, on three separate sheets F1, F2 and F3, for example, the designs of a PCB component side, soldering side, solder resist, and any other designs that may be needed. Sheets F1, F2, and F3 are made of moisture and heat proof films, which are preferably flexible, have a thickness of from 5 to 200 microns, and can receive ink. The sheets F1, F2 and F3 are preferably made of polyethylene-terephthalate, such as sold under the DuPont trademark Mylar.

Each sheet F1-F3 is drawn with ink, e.g., F1 with the component side design, F2 with the soldering side design and F3 with the solder resist design. These designs may have a graduated scale greater than 1:1 in order to reduce errors during printing. Printing, performed in step 2, consists of applying and fixing conducting material (e.g., copper powder) on the designs on shsets F1, F2 and F3.

Thus, printed sheets FS1, FS2 and FS3, shown at 3, have the printed circuit layout and solder resist patterns impressed on them. In step 4, the printed sheets FS1-FS3 are firmly applied (e.g., with glue) to the two faces of rigid dielectric materials.

In step 5, a treatment is performed to thicken the sections of the printed designs on sheets FS1 and FS2 with conducting material.

Such treatment may be done with chemical means (e.g., by applying chemical copper) and/or mechanical means (e.g., overmelting or with other known suitable means).

In step 6, a final quality test is carried out and in step 7, mechanical processes take place to obtain the desired shape (blocking-out) of the finished board in case of surface mounting of PCBs without holes. If the printed circuit boards outgoing from step 5 are provided with metallized holes, they will undergo the conventional treatment of traditional boards, such as drilling, pickling, sensitization, covering, chemical copper catalysis, galvanic copper flash, surface activation, galvanic copper, activation, Sn-Pb alloy deposit, solder resist printing, solder resist boiling, final testing and mechanical processing.

In summary, the printed circuit boards according to the invention consist of a rigid support S, e.g., a board of synthetic material having a thickness from 0.5 to 20 mm., and two flexible sheets, one of them, FS1, carrying the circuit design, and the other one, FS2, the pattern of the soldering side. Sheets FS1-FS3 obtained from non-photographic plotted sheets, F1, F2 and F3, are printed according to desired patterns with conducting material, and then are fixed to the support S major faces before thickening of the conductors in step 5 and conventional treatments in steps 6 and 7.

FIG. 3, which is similar to FIG. 1, shows key stages of the process of PCBs being manufactured.

Figure 3A:
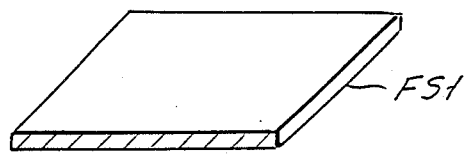
FIG. 3 shows a PCB at various stages of manufacture according to the invention.
Figure 3B:
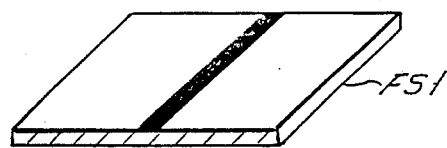

FIG. 3A illustrates a flexible sheet, e.g., FS1, which may be of 50 micron Mylar. FIG. 3B illustrates track III first designed with a graphic plotter and then printed with conducting material on sheet FS1.

Figure 3C:
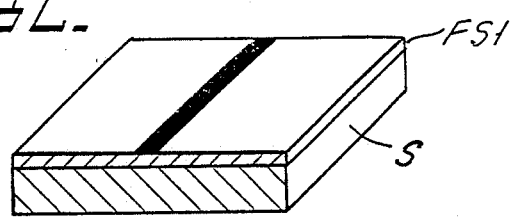

FIG. 3C shows sheet FS1 applied to the board S.

Figure 3D:
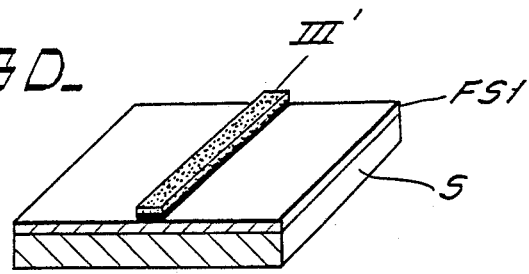

FIG. 3D shows track III applied to sheet FS1 and thickened with a second layer of copper or other conducting material III'.

Figure 4:
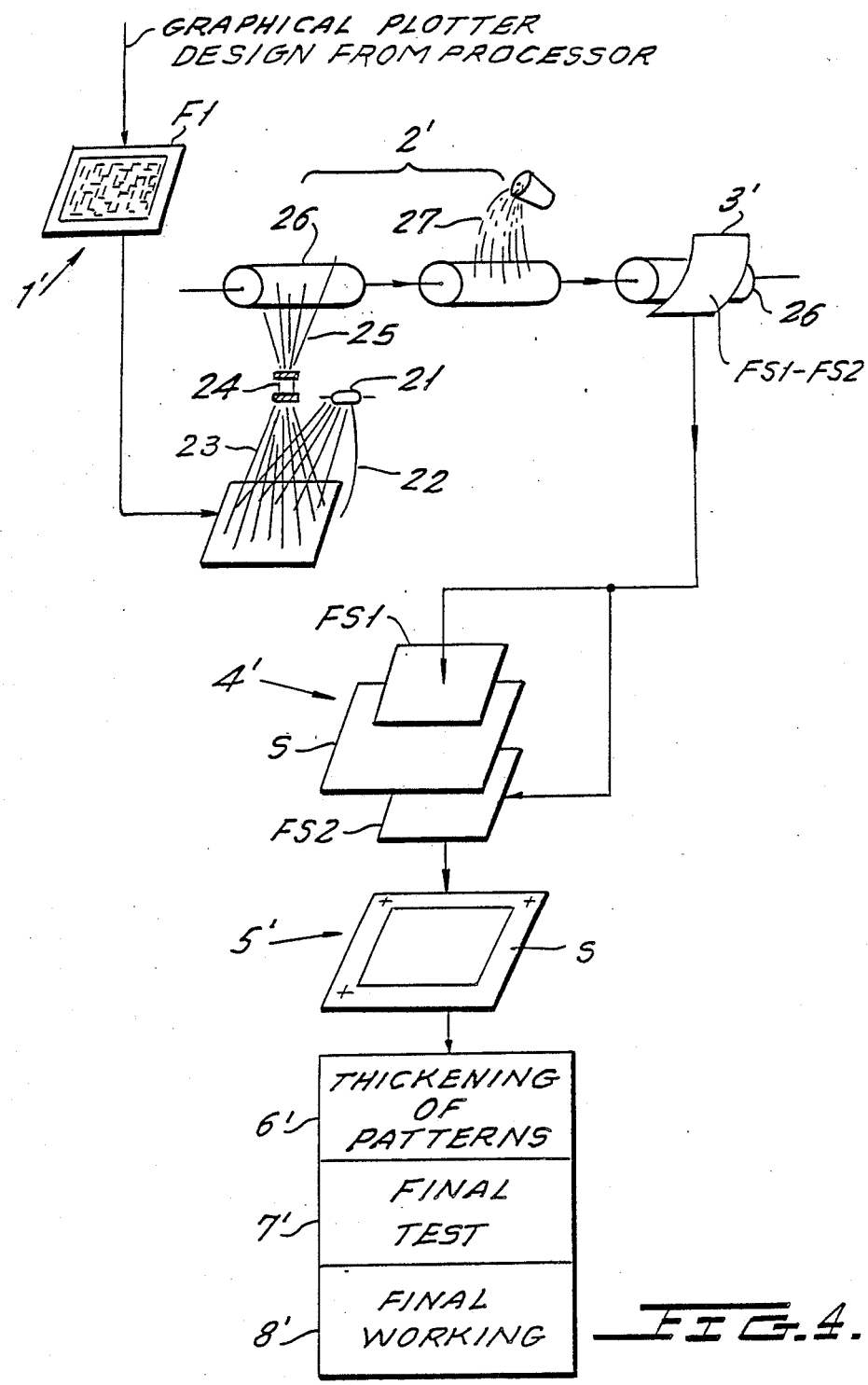
FIGS. 4–6 show further process schemes of the invention.

FIG. 4 shows an embodiment of the invention, wherein step 1' shows one of the films, e.g., film F1 on which the circuit design is graphically plotted in ink. Sheet F1 preferably is a china ink master in a graduated scale from 1:1 to 4:1. In step 2', a simple system for applying conducting material to inked design on film F1 is shown. The plotted upper surface of F1 is illuminated by a light source 21 (e.g., a flash) the rays of which 22 are reflected (as rays 23) to a lens system 24. The output rays 25 of system 24 are directed towards a drum 26, which may be selenium. In this way, on the drum a labile image of the ink plotted design is formed. A metallic powder 27 is applied to the plotted design image. The metallic powder is in a colloidal state preferably containing Cu, Ag, Zn and Au and being able to attach only on the opposite electrostatic charge regions, i.e., only on the image. This photostatic application procedure is similar to the application of toner in a photostatic copying machine.

In step 3', selenium drum 26 prints and fixes the metallic pattern on sheet FS1. Printing and fixing are repeated for sheet FS2 that carries the pattern of the soldering side. In step 4', sheets FS1 and FS2 are glued to the two major faces of a rigid support S, which is much thicker than sheets FS1 and FS2, e.g., by 0.5 to 20 mm.

Essentially, support S is a substrate obtained by compressing or injecting synthetic material, e.g., one or more (co) polymers of olefines, vinyl compounds, esters, amids, dichloroethylenes, etc. These materials have the advantage of being dielectric and stable and may be treated on the surface to increase adhesion to the printed sheets FS1-FS3. However, the rigid support S can also be metallic or partially metallic.

In fact, upon increasing the degree of integration, hence the concentration of electronic components, much more heat is produced per surface unit support of S and must be dispersed. Therefore, if support S is made of synthetic material, it is coupled to a heat sink of aluminum, for example.

The process of the invention in which the circuit and soldering patterns are applied, not directly to the rigid support S, but instead to thin flexible sheets FS1, FS2 has the further advantage that support S can be designed to efficiently conduct away from circuit components mounted on sheet FS1 or FS2. After laminating step 4', board S is drilled with squared reference holes from CAM in step 5'.

The boards outgoing from step 5' are treated in step 6' to thicken the pattern of conductors, and upon having been quality tested in step 7', are sent for final working in step 8, which will be exclusively mechanical for surface mounted boards without holes 8", or other mechanical, drilling or electrochemical processes if traditional PCBs with metallic holes are involved.

Figure 5:
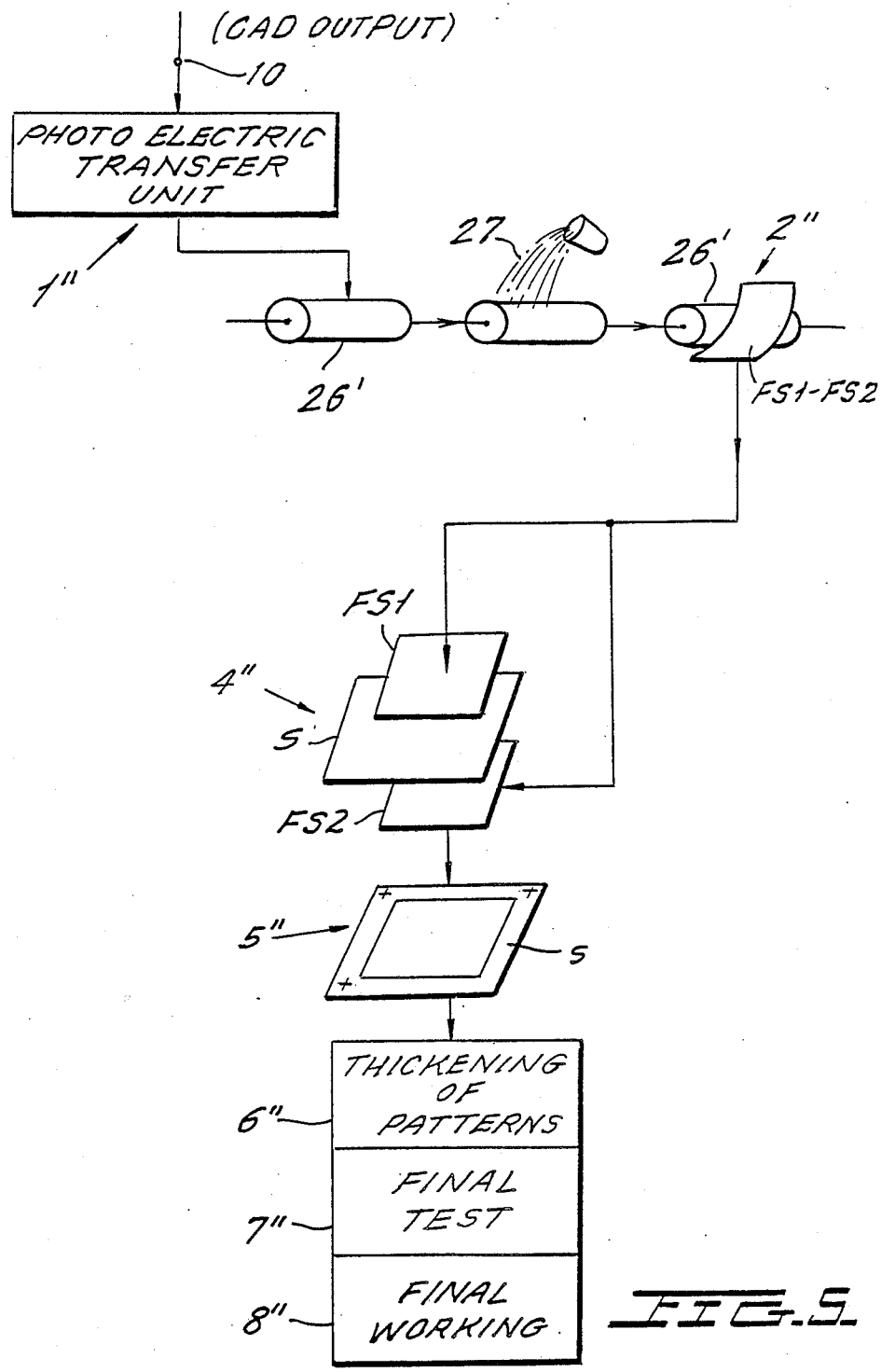

FIG. 5 shows the most preferred embodiment of the invention. In this case the first three steps of the process of FIG. 2, i.e., the use of the CAD signal, its application to a graphic plotter, and the preparation of the ink plotted sheets F1, F2 and F3 are eliminated by directly using a digitized graphic output 10 from a computer (not shown) and by applying this digital signal to a photoelectric transfer unit 1". Unit 1" transfers the graphic output directly to a photoconductor drum 26' (corresponding to drum 26 of FIG. 4). Drum 26' receives toner 27 and then provides in step 2" the sheets FS1 and FS2. These sheets are then submitted to the same further operations of FIG. 4, i.e., are fixed to a support S (step 5") to provide a PCB with support S bearing the printed sheets FS1 and FS2. The thus-formed PCB is treated in step 6" to thicken the conductive patterns, and is subjected to a final quality test 7", and conventional workings 8" to complete the PCB.

Directly applying graphic digitized output 10 (FIG. 5) to a drum 26' eliminates the need for a graphic plotter 1', the relevant master F1 and the optical transfer system 21 through 25 of FIG. 4.

Figure 6:
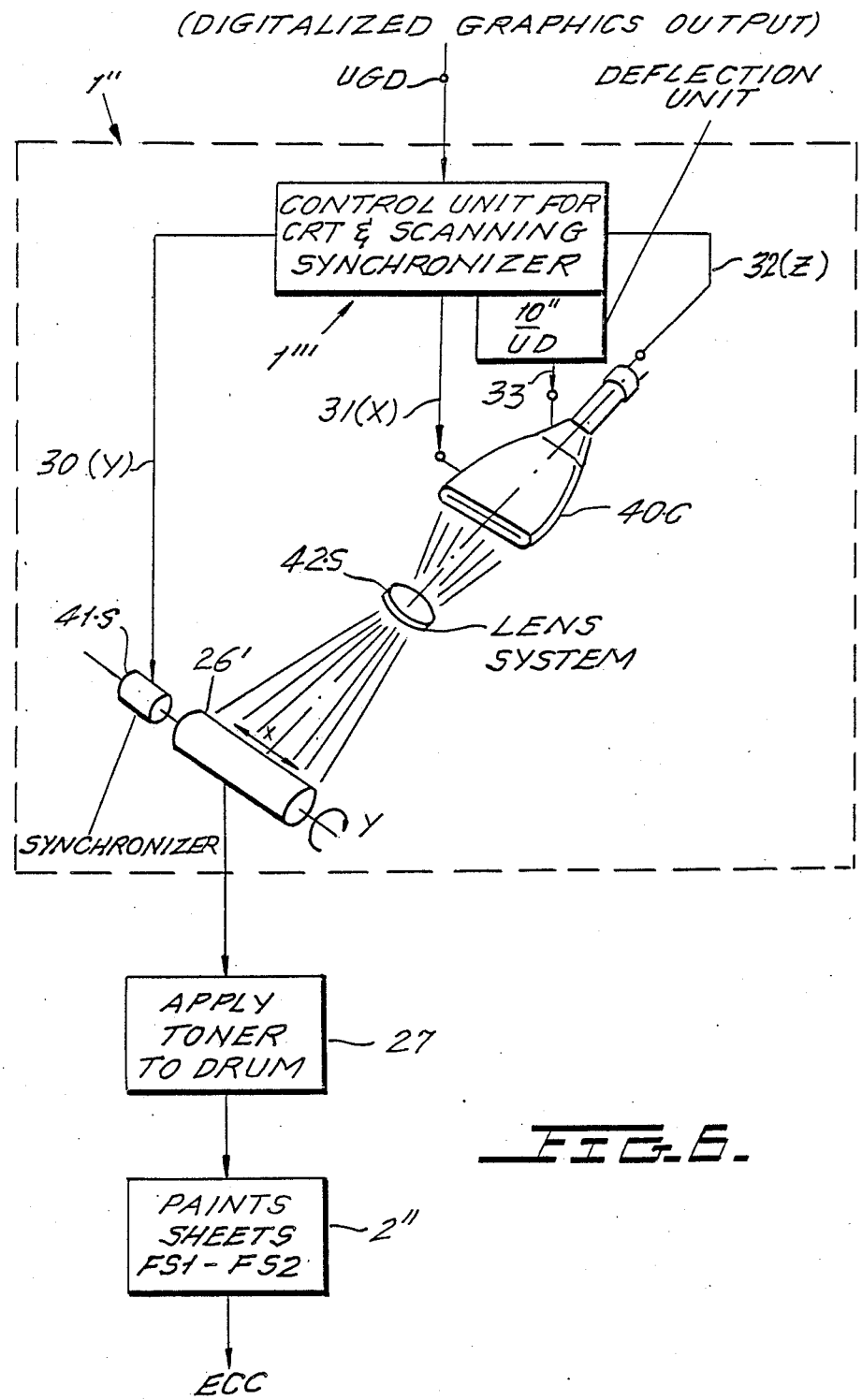

FIG. 6 shows a preferred embodiment of the transfer unit 1'' of FIG. 5. It comprises, as shown in FIG. 6, a cathode ray tube 40, a synchronizer 41, and a control unit 1'' for the cathode ray tube and scanning synchronizer. Scanning synchronizer 41 delivers signals to command the positioning on the Y axis of drum 26' through line 30 and synchronizer 41, and of the X axis (line 31) and the Z axis (line 32) of the drum. Control signals on lines 31 and 32 act on the rays leaving tube 40. Such rays are directed through optical line system 42 to create a labile image on drum 26'.

Control unit 1'' also comprises a deflection unit 10'' acting on cathode ray tube 40 through line 33. As in FIGS. 4 and 5, the drum 26' undergoes operation 27 (toner application) and 2'' (transfer of the toner tracks from drum 26 to print the sheets FS1–FS2).

As is apparent from the foregoing specification, the method and products of the present invention are susceptible of being embodied with various alterations and modifications which fall within the scope of the invention, whereby the specification and drawings are intended as illustrative and not restrictive.

I claim:

1. A process for manufacturing printed circuit boards including a rigid support carrying, on a first major side, circuit components distributed according to a desired design, and, on a second major side, soldered wires corresponding to the circuit components, wherein the process comprises the steps of:
    producing on a photoconductive surface respective labile electrostatic images of the desired designs of said circuit components and of said soldered wires;
    applying electrically conductive material on said labile images on said surface;
    transferring the so-distributed conductive material from said surface onto respective insulating sheets by printing;
    affixing the insulating sheets to opposite sides of said rigid support;
    treating said insulating sheets to increase the thickness of said conductive material; and
    processing the resulting structure to complete a printed circuit board suitable for supporting the circuit components and the soldered wires.

2. A process according to claim 1, wherein said step of producing labile electrostatic images comprises producing said images on a photoconductive drum.

3. A process according to claim 2, wherein said electrically conductive material comprises a colloidal conductive powder.

4. A process according to claim 3, wherein said steps of producing labile electrostatic images comprises the steps of:
    applying a CAD output to a graphic plotter; reproducing with the graphic plotter the circuit component design and the soldering design on respective china ink masters; and
    optically transferring the ink designs on the china masters to a selenium drum.

5. A process according to claim 1, wherein said step of producing labile electrostatic images comprises producing said images with a graphic digitized output from a computer and applying said images directly on a photoconductive drum by electro-photographic transfer.

6. A process according to claim 5, wherein said electro-photographic transfer comprises using a cathode ray linear tube, an optical projector between said tube and the photoconductive drum, and a synchronizer for the drum.

7. A printed circuit board produced by the process of claim 1.

8. A printed circuit board produced by the process of claim 2.

9. A printed circuit board produced by the process of claim 3.

10. A printed circuit board produced by the process of claim 4.

11. A printed circuit board produced by the process of claim 5.

12. A printed circuit board produced by the process of claim 6.

* * * * *